(12) United States Patent
Mitsubori et al.

(10) Patent No.: US 9,530,459 B2
(45) Date of Patent: Dec. 27, 2016

(54) SEMICONDUCTOR MEMORY DEVICE INCLUDING A REPEATER CIRCUIT ON MAIN DATA LINES

(71) Applicant: Micron Technology, Inc., Boise, ID (US)

(72) Inventors: Shingo Mitsubori, Tokyo (JP); Hiroki Fujisawa, Tokyo (JP)

(73) Assignee: Micron Technology, Inc., Boise, ID (US)

( * ) Notice: Subject to any disclaimer, the term of this patent is extended or adjusted under 35 U.S.C. 154(b) by 78 days.

(21) Appl. No.: 14/523,704

(22) Filed: Oct. 24, 2014

(65) Prior Publication Data

US 2015/0120997 A1    Apr. 30, 2015

(30) Foreign Application Priority Data

Oct. 25, 2013    (JP) .................................. 2013-221945

(51) Int. Cl.

| | | |
|---|---|---|
| G11C 7/00 | (2006.01) | |
| G11C 5/02 | (2006.01) | |
| G11C 7/08 | (2006.01) | |
| G11C 7/10 | (2006.01) | |
| G11C 7/12 | (2006.01) | |
| G11C 11/4091 | (2006.01) | |
| G11C 11/4094 | (2006.01) | |
| G11C 11/4096 | (2006.01) | |

(52) U.S. Cl.
CPC ................. *G11C 5/025* (2013.01); *G11C 7/08* (2013.01); *G11C 7/1048* (2013.01); *G11C 7/1051* (2013.01); *G11C 7/1069* (2013.01); *G11C 7/12* (2013.01); *G11C 11/4091* (2013.01); *G11C 11/4094* (2013.01); *G11C 11/4096* (2013.01)

(58) Field of Classification Search
CPC ........... G11C 7/10; G11C 7/1048; G11C 7/00; G11C 8/00; G11C 5/025; G11C 5/063; G11C 11/4096; G11C 11/4097; G11C 11/413
USPC ......... 365/205, 208, 230.03, 230.06, 51, 63, 365/219
See application file for complete search history.

(56) References Cited

U.S. PATENT DOCUMENTS

| | | | | |
|---|---|---|---|---|
| 6,421,294 | B2 * | 7/2002 | Hidaka | .................... 365/230.01 |
| 7,663,962 | B2 * | 2/2010 | Jeong | .................. G11C 7/1048 |
| | | | | 365/189.17 |
| 7,715,261 | B2 * | 5/2010 | Kim | ....................... G11C 5/063 |
| | | | | 365/205 |
| 2007/0070756 | A1 * | 3/2007 | Kim | ......................... G11C 7/06 |
| | | | | 365/208 |

FOREIGN PATENT DOCUMENTS

JP    2011-034645    2/2011

* cited by examiner

*Primary Examiner* — Gene Auduong
(74) *Attorney, Agent, or Firm* — Dorsey & Whitney LLP

(57) ABSTRACT

A semiconductor memory disclosed in this disclosure includes first and second memory cell arrays, a first main data line that transfers the read data read from the first memory cell array, a second main data line that transfers the read data read from the second memory cell array, a main amplifier coupled to the second main data line, and a repeater circuit coupled to the first main data line and the second main data line.

20 Claims, 15 Drawing Sheets

SEMICONDUCTOR MEMORY DEVICE INCLUDING A REPEATER CIRCUIT ON MAIN DATA LINES

This application is based upon and claims the benefit of priority from Japanese Patent Application No. 2013-221945 filed on Oct. 25, 2013, the disclosure of which are incorporated herein in its entirely by reference.

BACKGROUND

Field of Invention

The present invention relates to a semiconductor device. It particularly relates to a semiconductor device including a main data line that transfers data read from a memory cell array to a main amplifier.

Description of the Related Art

In semiconductor devices, such as DRAM (Dynamic Random Access Memory), the reduction of chip size is important for the reduction of chip unit price. The reduction of chip size in DRAM can be achieved mainly by reducing the size of a memory cell array, and the size reduction percentage in peripheral circuits tends to be lower as compared with the memory cell array. Accordingly, the proportion of peripheral circuits in the entire chip has been increasing year by year, and, in order to further reduce the chip size, it is important to reduce the size of peripheral circuits.

Meanwhile, in synchronous DRAM, for the enhancement of the data transfer rate, attempts have been made to increase the number of prefetches or improve the operation frequency. However, when the number of prefetches is increased, or the operation frequency is improved, the timing margin in data transfer decreases. Thus, a high-precision timing design is required.

Here, it is sometimes difficult to achieve both the size reduction of peripheral circuits and the expansion of the timing margin.

For example, focusing attention on the data transfer between a memory cell array and a main amplifier, when the length of the main data (IO) line that couples the memory cell array and the main amplifier is designed to be short, it becomes unnecessary to couple a sub-amplifier (see Japanese Patent Application Laid Open No. 2011-34645) or the like to the main data line, whereby the timing design is facilitated. However, when the main data line is short, this increases the number of required main amplifiers, and also increases the routing length of a read write bus, resulting in an increase in the circuit scale of peripheral circuits.

Meanwhile, when the length of the main data line is designed to be long, the size of peripheral circuits can be reduced. However, it becomes necessary to control the operation timing of a sub-amplifier, etc., with high precision, making the timing design difficult.

Against the above background, there has been a demand for a semiconductor device that allows peripheral circuits to be reduced in size and also facilitates the timing design.

SUMMARY

According to a first aspect of the present invention, there is provided a semiconductor device including:
first and second memory cell arrays, each of first and second memory cell arrays including a plurality of memory cells;
a first main data line arranged above the first memory cell array to transfer data read from the first memory cell array;
a second main data line arranged above the second memory cell array to transfer data read from the second memory cell array;
a main amplifier coupled to the second main data line to amplify the data on the second main data line; and
a repeater circuit coupled to the first and second main data lines to transfer data on the first main data line to the second main date line.

According to another aspect of the present invention, there is provided a semiconductor device including:
a first memory bath and a second memory bank, each of the first and second memory banks including:
first and second memory cell arrays,
a plurality of first main data lines associated with the first memory cell array,
a plurality of second main data lines associated with the second memory cell array,
a plurality of main amplifiers, each coupled to an associated one of the plurality of second main data lines, and
a plurality of repeater circuits each coupled to an associated one of the plurality of first main data lines and to an associated one of the plurality of second main data lines to transfer data on the associated one of the plurality of first main data lines to an associated one of the plurality of main amplifiers via the associated one of the plurality of second data lines; and
a plurality of data buses each coupled to an associated one of the plurality of main amplifiers of the first memory bank and further coupled to an associated one of the plurality of main amplifiers of the second memory bank.

According to yet another aspect of the present invention, there is provided a semiconductor device that comprises:
a first memory cell array;
a second memory cell array;
a plurality of first main IO lines associated with the first memory cell array;
a plurality of second main IO lines associated with the second memory cell array;
wherein the first memory cell array includes
a memory mat including a plurality of memory cells each coupled to an associated one of a plurality of bit lines and to an associated one of a plurality of sub word lines,
a sub word driver circuit coupled to the plurality of sub word lines; and
a plurality of sense amplifier circuits each coupled to an associated one of the plurality of bit lines and to an associated one of the plurality of first main IO lines to amplify data on the associated one of the plurality of bit lines and transfer the amplified data to the associated one of the plurality of first main IO lines responsive to a plurality of control signals,
wherein the second memory cell array includes
a memory mat including a plurality of memory cells each coupled to an associated one of a plurality of bit lines and to an associated one of a plurality of sub word lines,
a sub word driver circuit coupled to the plurality of sub word lines; and
a plurality of sense amplifier circuits each coupled to an associated one of the plurality of bit lines and to an associated one of the plurality of second main IO lines to amplify data on the associated one of the plurality of bit lines and transfer the amplified data to the associated one of the plurality of second main IO lines via a plurality of local IO lines responsive to the plurality of control signals, a plurality of first control lines each coupled to an associated one of the plurality of sense amplifier circuits of the first memory cell array;

a plurality of second control lines each couple to an associated one of the plurality of sense amplifier circuits of the second memory cell array; and a plurality of repeater circuits coupled to an associated one of the plurality of first lines to an associated one of the second lines.

In various embodiments of the present invention, first and second main IO lines associated with memory cell arrays are coupled by a repeater circuit. As a result, peripheral circuits can be reduced in size, and also the timing design is facilitated.

EMBODIMENTS

Figure 1:
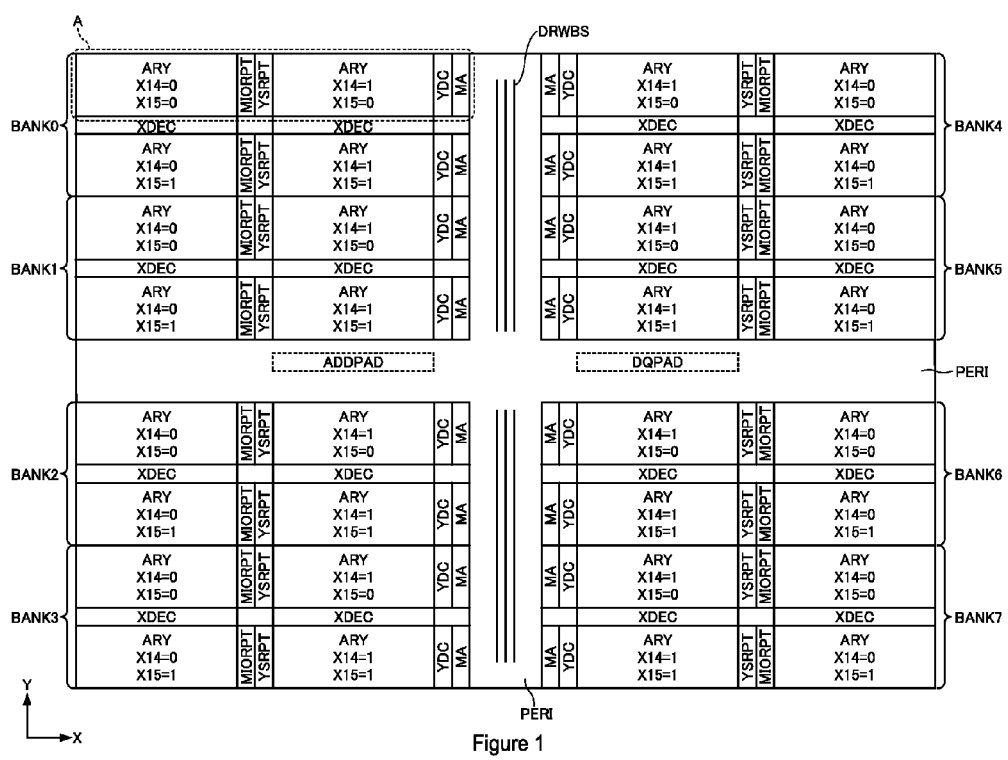
FIG. 1 is a schematic plan view showing the entire layout of a semiconductor device according to an embodiment of the present invention.

FIG. 1 is a schematic plan view showing the entire layout of a semiconductor device according to an embodiment of the present invention.

As shown in FIG. 1, a semiconductor device according to this embodiment includes a plurality of memory cell arrays ARY arranged in matrix and a peripheral circuit area PERI provided between the memory cell arrays ARY. In this embodiment, four memory cell arrays ARY constitute one memory bank. A memory bank herein refers to a unit that is mutually non-exclusively accessible. As shown in FIG. 1, in this embodiment, memory banks BANK0 to BANK3 are arranged on one side of a chip in the X-direction (left side), and memory banks BANK4 to BANK7 are arranged on the other side in the X-direction (right side).

In addition, at the center of the chip in the Y-direction, a peripheral circuit area PERI extending in the X-direction is provided, and external terminals, such as an address terminal ADDPAD and a data terminal DQPAD, are arranged in this area. In addition, at the center of the chip in the X-direction, a peripheral circuit area PERI extending in the Y-direction is provided, and a read write bus DRWBS and the like are arranged in this area.

Here, focusing attention on one memory bank, at one end of the memory bank in the X-direction (right side in the memory bank BANK0), a main amplifier area MAA and a column decoder YDC are arranged. In addition, of the four memory cell arrays ARY that constitute the memory bank, repeater circuits MIORPT and YSRPT are arranged between two memory cell arrays ARY that are adjacent in the X-direction, and a row decoder XDEC is arranged between two memory cell arrays ARY that are adjacent in the Y-direction. In addition, the four memory cell arrays ARY that constitute one memory bank are exclusively selected by the top two bits (X14 and X15) of the row address. The memory cell arrays ARY to be selected by the bits X14 and X15 of the row address are as shown in FIG. 1.

Figure 2:
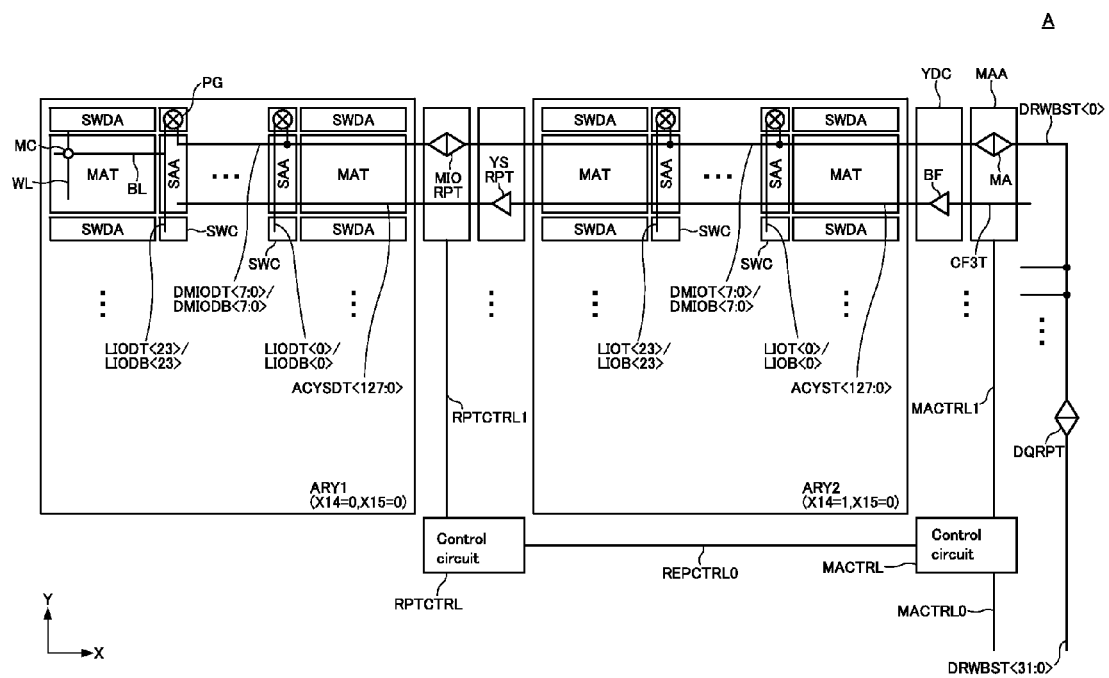
FIG. 2 shows the detail of the area A shown in FIG. 1.

FIG. 2 shows the detail of the area A shown in FIG. 1.

As shown in FIG. 2, each memory cell array ARY includes a plurality of memory mats MAT arranged in matrix. In addition, between two memory mats MAT that are adjacent in the X-direction, a sense amplifier area SAA, in which a plurality of sense amplifiers are arranged, is provided. Further, on both sides of the memory mat MAT in the Y-direction, a sub-word driver area SWDA, in which a plurality of sub-word drivers are arranged, is provided. Then, in a sub-word crossed area SWC equivalent to a corner of the memory mat MAT, the below-mentioned equalizing circuit, pass gate circuit, and the like are arranged.

Each memory mats MAT is made up of a plurality of memory cells MC, and the selection is made in response to the row address and the column address. Specifically, when a row address is input, by the control of the row decoder XDEC shown in FIG. 1, one of the sub-word drivers included in the sub-word driver area SWDA is activated, whereby the corresponding word line WL is selected. When one of word lines WL is selected, the data stored in the corresponding memory cell MC is read to a bit line BL. The data read to the bit line BL is amplified by the sense amplifier provided in the sense amplifier area SAA.

Subsequently, when a column address is input, one of column selection lines ACYST is selected by the control of the column decoder YDC. Column selection lines ACYST are assigned to the memory cell array ARY2 (X14=1) on the right side, and 128 column selection lines ACYST <127:0> are assigned to 25 memory mats MAT extending in the X-direction. In addition, the column selection lines ACYST are each coupled to a column selection line ACYSDT through a repeater circuit YSRPT. Column selection lines ACYSDT are assigned to the memory cell array ARY1

(X14=0) on the left side, and 128 column selection lines ACYSDT <127:0> are assigned to 25 memory mats MAT extending in the X-direction.

Then, when a column selection line ACYST <127:0> or ACYSDT <127:0> is activated, the read data amplified by the sense amplifier is transferred to a local data line LIO or LIOD. Here, the local data line LIO is a local data line provided in the memory cell array ARY2 on the right side, while the local data line LIOD is a local data line provided in the memory cell array ARY1 on the left side. Both local data lines LIO and LIOD extend in the Y-direction, and are made up of complementary local data lines LIOT/LIOB and LIODT/LIODB, respectively.

In FIG. 2, the indication LIOT <0>/LIOB <0> refers to the local data line LIO on the sense amplifier area SAA arranged on the rightmost side in the memory cell array ARY1, and the indication LIOT <23>/LIOB <23> refers to the local data line LIO on the sense amplifier area SAA arranged on the leftmost side in the memory cell array ARY1. Similarly, the indication LIODT <0>/LIODB <0> refers to the local data line LIOD on the sense amplifier area SAA arranged on the rightmost side in the memory cell array ARY2, and the indication LIODT <23>/LIODB <23> refers to the local data line LIOD on the sense amplifier area SAA arranged on the leftmost side in the memory cell array ARY2. Accordingly, in each of the memory cell arrays ARY1 and 2, 24 sense amplifier areas SAA are provided in the X-direction. Incidentally, in this embodiment, each memory mats MAT has a so-called open-bit-line layout. Therefore, the memory mat MAT located on both ends in the X-direction have only half the memory size of other memory mats MAT.

In the memory cell array ARY2 on the right side, the read data transferred to the local data line LIO is transferred to the main data line DMIO through a pass gate circuit PG. The main data line DMIO is a line provided on the memory cell array ARY2 and extending in the X-direction, and is made up of complementary main data lines DMIOT/DMIOB. In this embodiment, eight pairs of main data lines DMIOT <7:0>/DMIOB <7:0> are arranged on the memory mat MAT included in the memory cell array ARY2.

In the memory cell array ARY1 on the left side, the read data transferred to the local data line LIOD is transferred to the main data line DMIOD through a pass gate circuit PG. The main data line DMIOD is a line provided on the memory cell array ARY1 and extending in the X-direction, and is made up of complementary main data lines DMIODT/DMIODB. In this embodiment, eight pairs of main data lines DMIODT <7:0>/DMIODB <7:0> are arranged on the memory mat MAT included in the memory cell array ARY1.

The main data line DMIO assigned to the memory cell array ARY2 has coupled thereto a main amplifier MA provided in the main amplifier area MAA. Accordingly, the read data transferred to the main data line DMIO is amplified by the main amplifier MA, and then transferred to a read write bus DRWBS. The read write bus DRWBS has inserted thereinto several repeater circuits DQRPT. As a result, the read data on the read write bus DRWBS is transferred to a non-illustrated data input/output circuit through the repeater circuits DQRPT, and then output to the outside from the data terminal DQPAD shown in FIG. 1. Incidentally, the read write bus DRWBS is provided to a plurality of memory banks in common. The flow of write data at the time of a write operation is the reverse of the flow of read data described above.

Meanwhile, the main amplifier MA is not directly coupled to the main data line DMIOD assigned to the memory cell array ARY1. The main data line DMIOD is coupled to the main data line DMIO through the repeater circuit MIORPT. Accordingly, the read data transferred to the main data line DMIOD is transferred to the main data line DMIO through the repeater circuit MIORPT, then amplified by the main amplifier MA, and transferred to the read write bus DRWBS.

The operation of the main amplifier MA and that of the repeater circuit MIORPT are controlled by control signals MACTRL1 and RPTCTRL1 output from control circuits MACTRL and RPTCTRL, respectively. As described below in detail, the timing of the activation of the main amplifier MA and the repeater circuit MIORPT differs between a read operation and a write operation. Specifically, at the time of a read operation, the activation of the repeater circuit MIORPT is followed by the activation of the main amplifier MA. In contrast, at the time of a write operation, the activation of the main amplifier MA is followed by the activation of the repeater circuit MIORPT.

Figure 3:
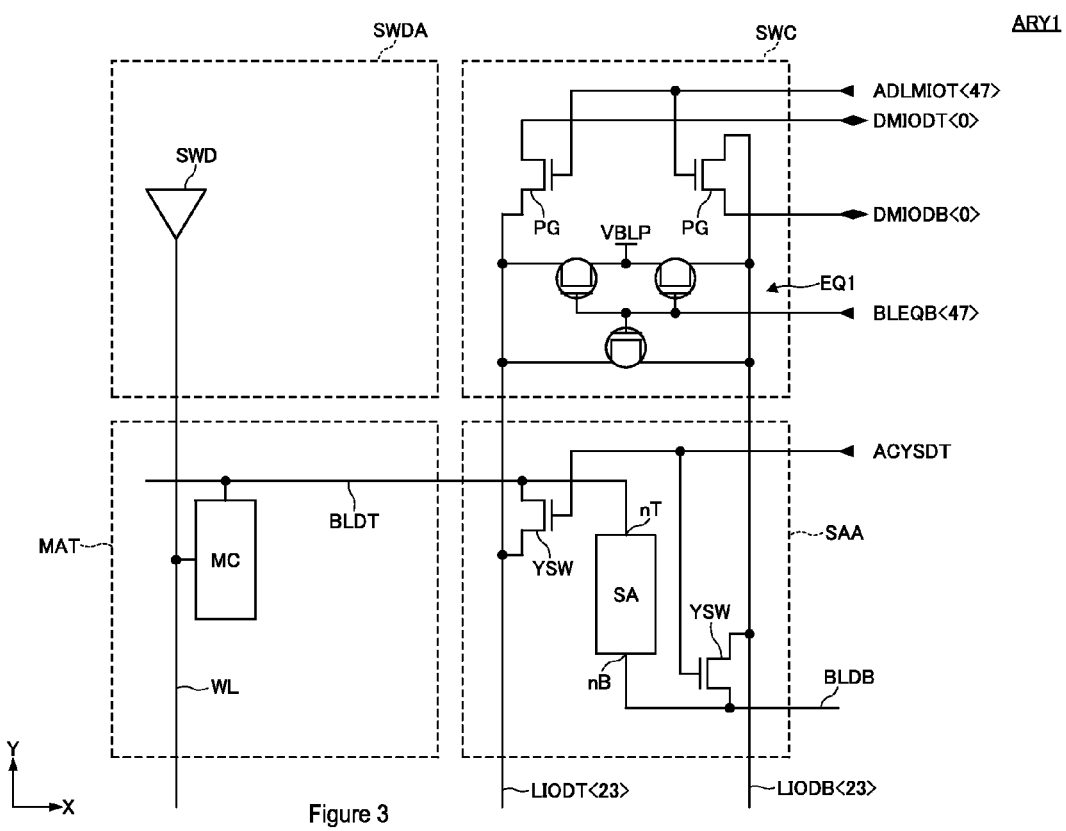
FIG. 3 is a circuit diagram showing the leftmost memory mat included in a memory cell array, as well as related circuits, according to an embodiment of the invention.
Figure 4:
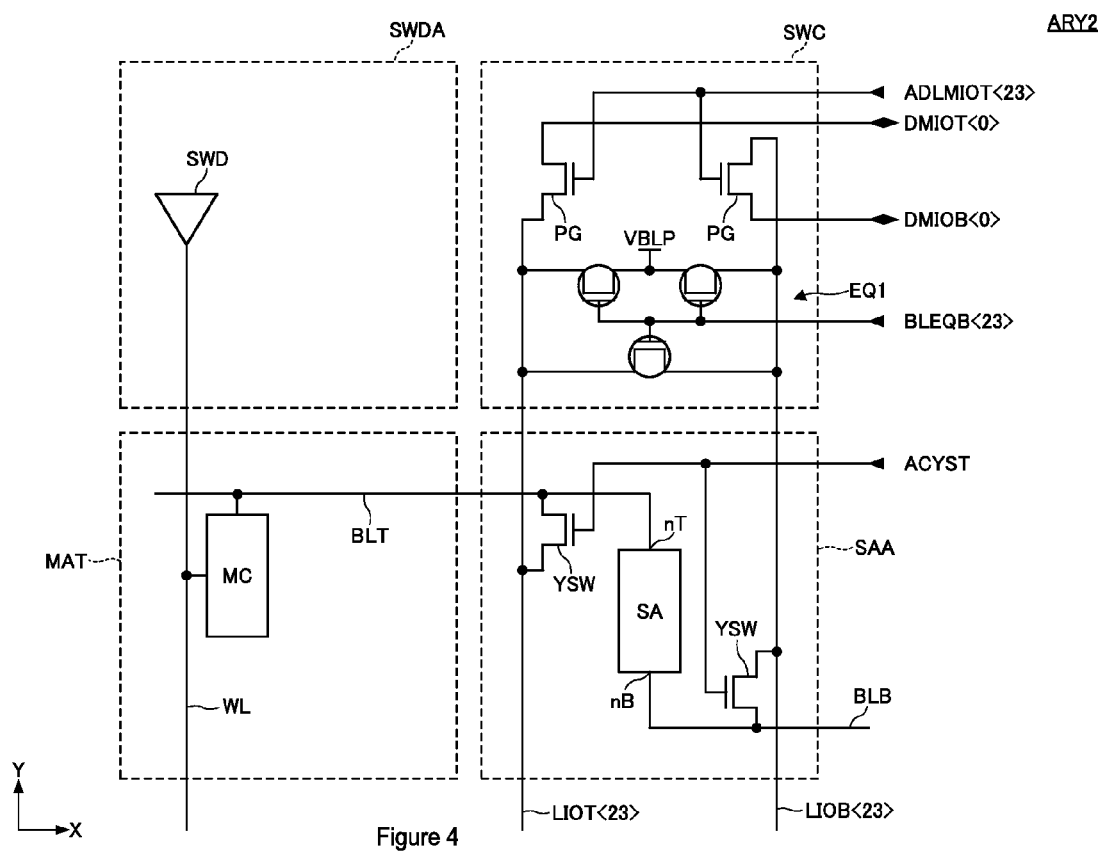
FIG. 4 is a circuit diagram showing the leftmost memory mat included in a memory cell array, as well as related circuits, according to an embodiment of the invention.

FIG. 3 is a circuit diagram showing the leftmost memory mat MAT included in the memory cell array ARY1, as well as related circuits, according to an embodiment of the invention and FIG. 4 is a circuit diagram showing the leftmost memory mat MAT included in the memory cell array ARY2, as well as related circuits, according to an embodiment of the invention.

As shown in FIG. 3 and FIG. 4, in the memory mat MAT, a memory cell MC is arranged at the intersection between a word line WL extending in the Y-direction and a bit line BLT or BLDT extending in the X-direction. The word line WL is driven by the sub-word driver SWD provided in the sub-word driver area SWDA. Meanwhile, the bit line BLT or BLDT is coupled to one input/output node nT of the sense amplifier SA provided in the sense amplifier area SAA. The other input/output node nB of the sense amplifier SA is coupled to the bit line BLB or BLDB provided in the other adjacent memory mat MAT.

The input/output nodes nT and nB of the sense amplifier SA are coupled to the complementary local data lines LIOT/LIOB and LIODT/LIODB, respectively, through a column switch YSW. The column switch YSW is made up of an N-channel type MOS transistor, and the gate electrode is coupled to a column selection line ACYST or ACYSDT. Accordingly, when the column selection line ACYST or ACYSDT is selected, the corresponding sense amplifier SA is coupled to the complementary local data lines LIOT/LIOB or LIODT/LIODB.

The local data lines LIOT/LIOB and LIODT/LIODB are coupled to an equalizing circuit EQ1 provided in the sub-word crossed area SWC. The equalizing circuit EQ1 is made up of three P-channel type MOS transistors, and the equalizing signals BLEQB <23> and BLEQB <47> are supplied to the gate electrodes. Although not illustrated, there are 48 kinds of equalizing signals BLEQB provided (BLEQB <47:0>), and one of them is selected by a mat address, which is a part of the row address.

Then, when the equalizing signal BLEQB <23> is activated to a low level, the local data lines LIOT <23> and LIOB <23> are each pre-charged to a pre-charge potential VBLP, while when the equalizing signal BLEQB <47> is activated to a low level, the local data lines LIODT <23> and LIODB <23> are each pre-charged to a pre-charge potential VBLP. The pre-charge potential VBLP is an intermediate potential between the high-level potential (VARY) and the low-level potential (VSS) output by the sense amplifier SA.

Further, the local data lines LIOT <23>/LIOB <23> and LIODT <23>/LIODB <23> are coupled to the main data lines DMIOT <0>/DMIOB <0> and DMIODT <0>/DMI- ODB <0>, respectively, through a pass gate circuit PG. The pass gate circuit PG is made up of an N-channel type MOS transistor, and a coupling signal ADLMIOT <23> or ADLMIOT <47> is supplied to the gate electrode. Although not illustrated, there are 48 kinds of coupling signals ADLMIOT provided (coupling signals ADLMIOT <47:0>), and one of them is selected by the mat address.

Then, when the coupling signal ADLMIOT <23> is activated to a high level, the local data lines LIOT <23> and LIOB <23> are electrically connected to the main data lines DMIOT <0> and DMIOB <0>, respectively. Similarly, when the coupling signal ADLMIOT <47> is activated to a high level, the local data lines LIODT <23> and LIODB <23> are electrically connected to the main data lines DMIODT <0> and DMIODB <0>, respectively. Incidentally, as the activation level of the coupling signal ADLMIOT, a boosting potential (VPP>VARY) sufficiently higher than the high-level potential (VARY) output by the sense amplifier SA is used. After a row address is input by an active command ACT, the coupling signals ADLMIOT <23> and ADLMIOT <47> are activated before a column address is input by a read command READ or a write command WRT.

Figure 5:
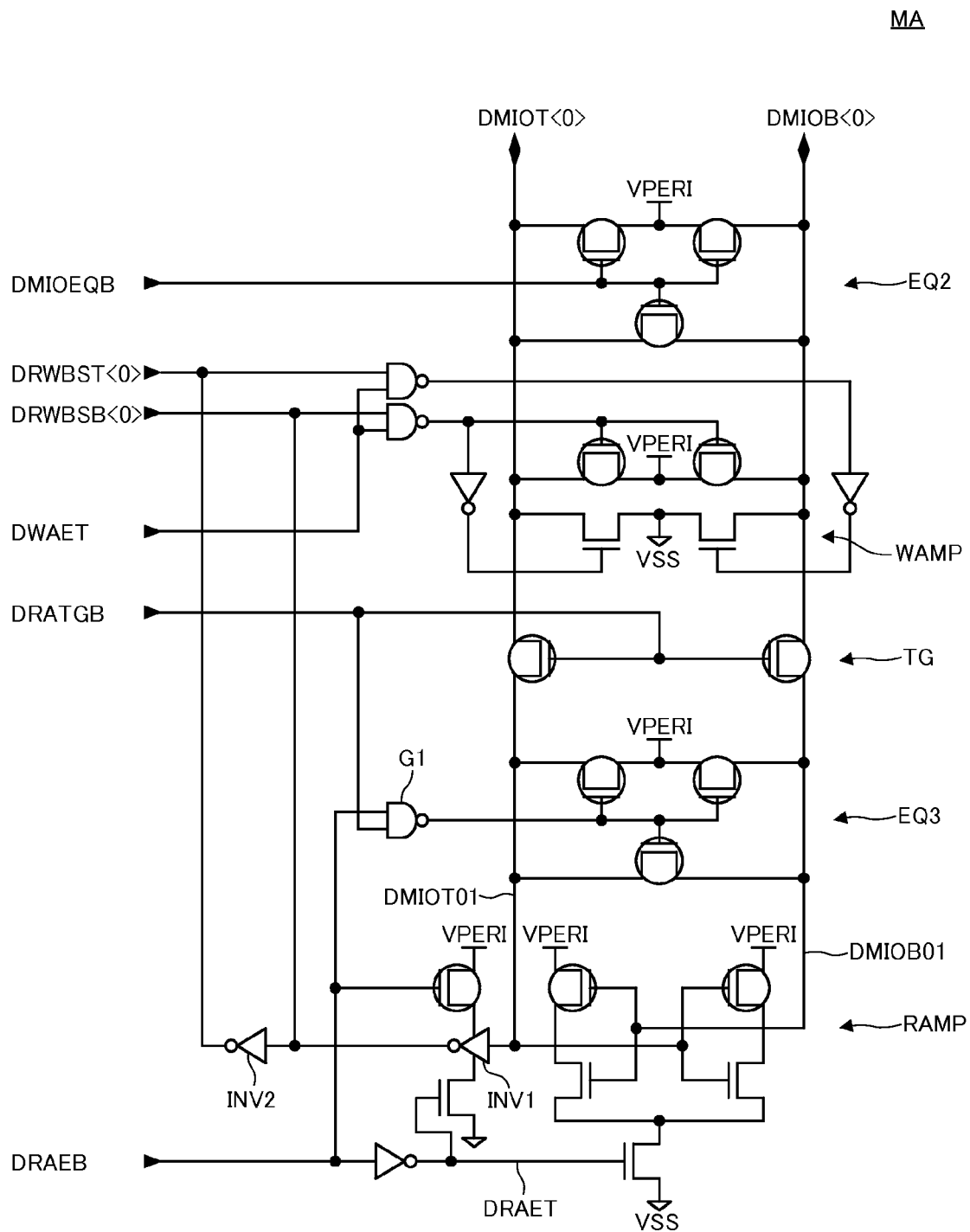
FIG. 5 is a circuit diagram of a main amplifier according to an embodiment of the invention.

FIG. 5 is a circuit diagram of a main amplifier MA according to an embodiment of the invention.

As shown in FIG. 5, the main amplifier MA includes a coupling gate TG, equalizing circuits EQ2 and EQ3, a write amplifier WAMP, and a read amplifier RAMP. The coupling gate TG is made up of two P-channel type MOS transistors. One transistor is coupled to the main data line DMIOT <0> and to the read data line DMIOT01, while the other is coupled to the main data line DMIOB <0> and to the read data line DMIOB01, and a coupling signal DRATGB is supplied to the gate electrodes. As a result, when the coupling signal DRATGB is activated to a low level, the main data lines DMIOT <0> and DMIOB <0> and the read data lines DMIOT01 and DMIOB01 are short-circuited.

The equalizing circuit EQ2 is made up of three P-channel type MOS transistors coupled to the main data lines DMIOT <0> and DMIOB <0>, and an equalizing signal DMIOEQB is supplied to the gate electrodes. Accordingly, when the equalizing signal DMIOEQB is activated to a low level, the main data lines DMIOT and DMIOB are pre-charged to a high-level power supply potential VPERI.

The equalizing circuit EQ3 is made up of three P-channel type MOS transistors coupled to the read data lines DMIOT01 and DMIOB01, and an output signal from a NAND gate circuit G1 is supplied to the gate electrodes. The NAND gate circuit G1 has supplied thereto the coupling signal DRATGB and a read enable signal DRAEB. Therefore, during the period in which these signals are all deactivated to a high level, the read data lines DMIOT01 and DMIOB01 are pre-charged to a high-level power supply potential VPERI.

The write amplifier WAMP is activated by the write enable signal DWAEB, and is made up of two P-channel type MOS transistors that drive the main data lines DMIOT <0> and DMIOB <0> to a high level (VPERI) and two N-channel type MOS transistors that drive them to a low level (VSS). Then, when the write enable signal DWAEB is activated to a low level, in response to the write data on read write buses DRWBST <0> and DRWBSB <0>, one of the main data lines DMIOT <0> and DMIOB <0> is driven to a high level (VPERI), while the other is driven to a low level (VSS).

The read amplifier RAMP has a flip-flop circuit configuration that amplifies a potential difference in the read data lines DMIOT01 and DMIOB01, and is activated by the read enable signal DRAEB. According to this configuration, when a read enable signal DRAET is activated to a high level, in response to a potential difference in the read data lines DMIOT01 and DMIOB01, one is driven to a high level (VPERI), while the other is driven to a low level (VSS). The read data on the read data lines DMIOT01 and DMIOB01 is transferred to the read write buses DRWBST <0> and DRWBSB <0> through tri-state inverters INV1 and INV2 that are activated by the read enable signals DRAET and DRAEB.

Figure 6:
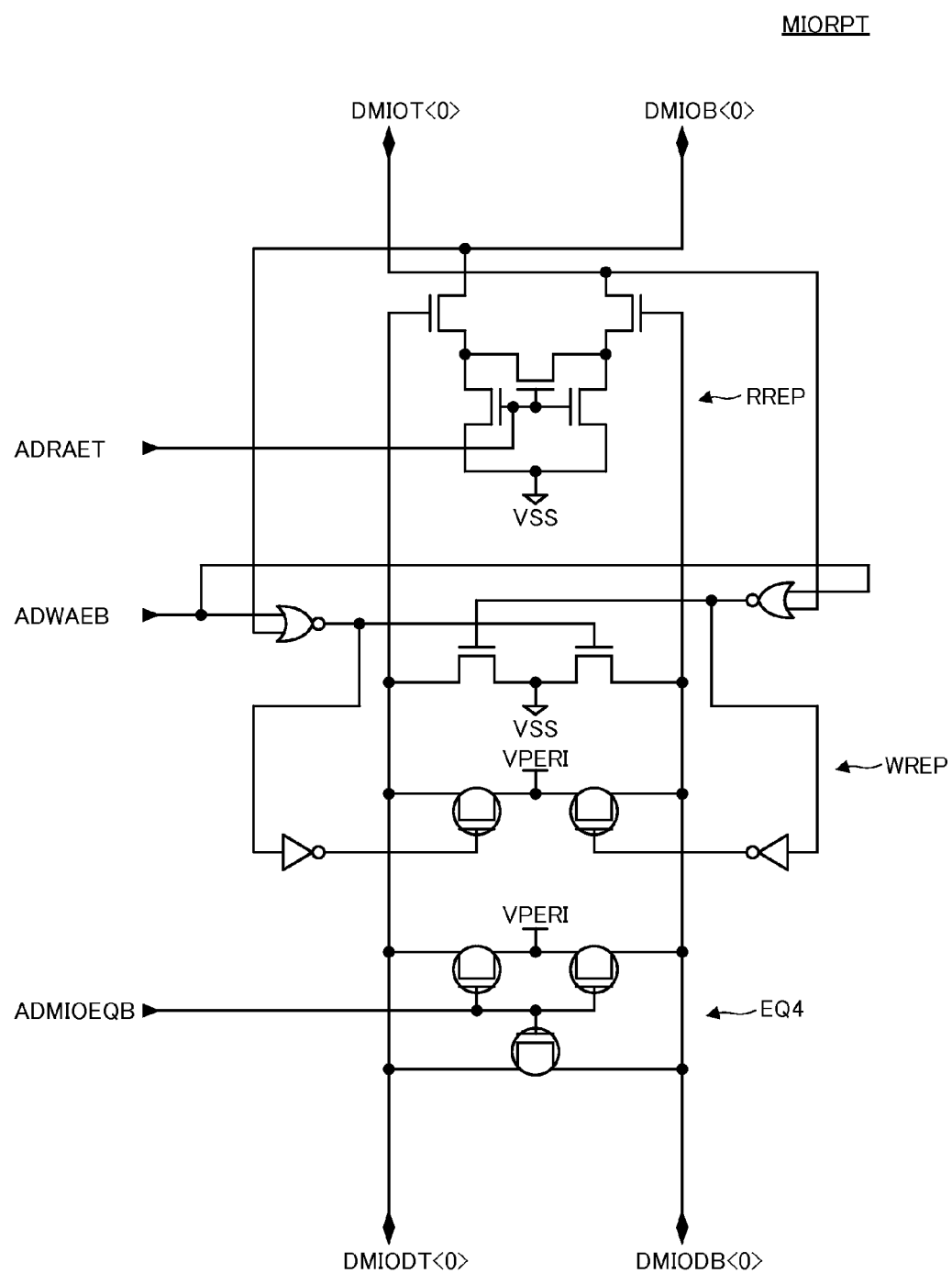
FIG. 6 is a circuit diagram of a repeater circuit according to an embodiment of the invention.

FIG. 6 is a circuit diagram of the repeater circuit MIORPT according to an embodiment of the invention.

As shown in FIG. 6, the repeater circuit MIORPT includes a read repeater circuit RREP, a write repeater circuit WREP, and an equalizing circuit EQ4.

The equalizing circuit EQ4 is made up of three P-channel type MOS transistors coupled to the main data lines DMIODT <0> and DMIODB <0>, and an equalizing signal ADMIOEQB is supplied to the gate electrodes. Accordingly, when the equalizing signal ADMIOEQB is activated to a low level, the main data lines DMIODT and DMIODB are pre-charged to a high-level power supply potential VPERI.

The read repeater circuit RREP includes an N-channel type MOS transistor, in which the gate electrode is coupled to the main data line DMIODT <0>, while the drain is coupled the main data line DMIOB <0>, and an N-channel type MOS transistor, in which the gate electrode is coupled to the main data line DMIODB <0>, while the drain is coupled the main data line DMIOT <0>. The sources of these transistors are grounded through three N-channel type MOS transistors that turn on in response to a read enable signal ADRAET. Accordingly, when the read enable signal ADRAET is activated to a high level, the read data on the main data lines DMIODT <0> and DMIODB <0> is transferred to the main data lines DMIOT <0> and DMIOB <0>.

The write repeater circuit WREP is activated by a write enable signal ADWAEB, and is made up of two P-channel type MOS transistors that drive the main data lines DMIODT <0> and DMIODB <0> to a high level (VPERI) and two N-channel type MOS transistors that drive them to a low level (VSS). Then, when the write enable signal ADWAEB is activated to a low level, in response to the write data on the main data lines DMIOT <0> and DMIOB <0>, one of the main data lines DMIODT <0> and DMIODB <0> is driven to a high level (VPERI), while the other is driven to a low level (VSS).

Figure 7:
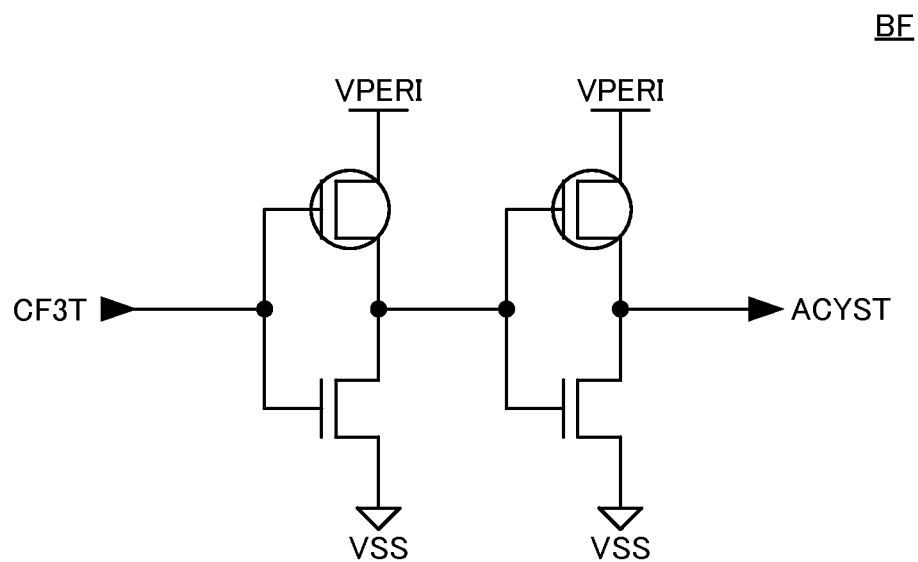
FIG. 7 is a circuit diagram of the final stage included in a column decoder according to an embodiment of the invention.

FIG. 7 is a circuit diagram of the final stage BF included in the column decoder YDC according to an embodiment of the invention.

As shown in FIG. 7, the final stage BF of the column decoder YDC is made up of a two-step inverter circuit that buffers a decoding signal CF3T, which is the result of decoding of the column address. Accordingly, when the decoding signal CF3T is activated to a high level in response to the value of the column address, the corresponding column selection line ACYST is driven to a high level (VPERI). As mentioned above, the column selection line ACYST is supplied to the column switch YSW included in the memory cell array ARY2.

Figure 8:
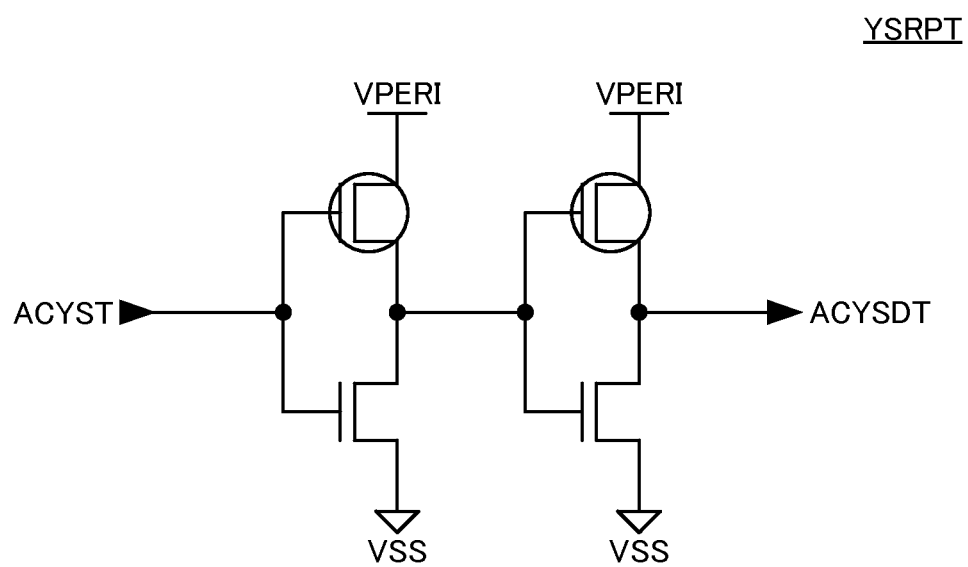
FIG. 8 is a circuit diagram of a repeater circuit according to a first example.

FIG. 8 is a circuit diagram of a repeater circuit YSRPT according to a first example.

As shown in FIG. 8, the repeater circuit YSRPT according to the first example has the same circuit configuration as the final stage of the column decoder YDC. Accordingly, when a predetermined column selection line ACYST is activated to a high level, the corresponding column selection line ACYSDT is driven to a high level (VPERI). As mentioned above, the column selection line ACYSDT is supplied to the column switch YSW included in the memory cell array ARY1.

The repeater circuit YSRPT according to the first example only buffers a column selection signal on the column selection line ACYSDT. Accordingly, no control signal or the like is required, and the circuit configuration can be simplified.

Figure 9:
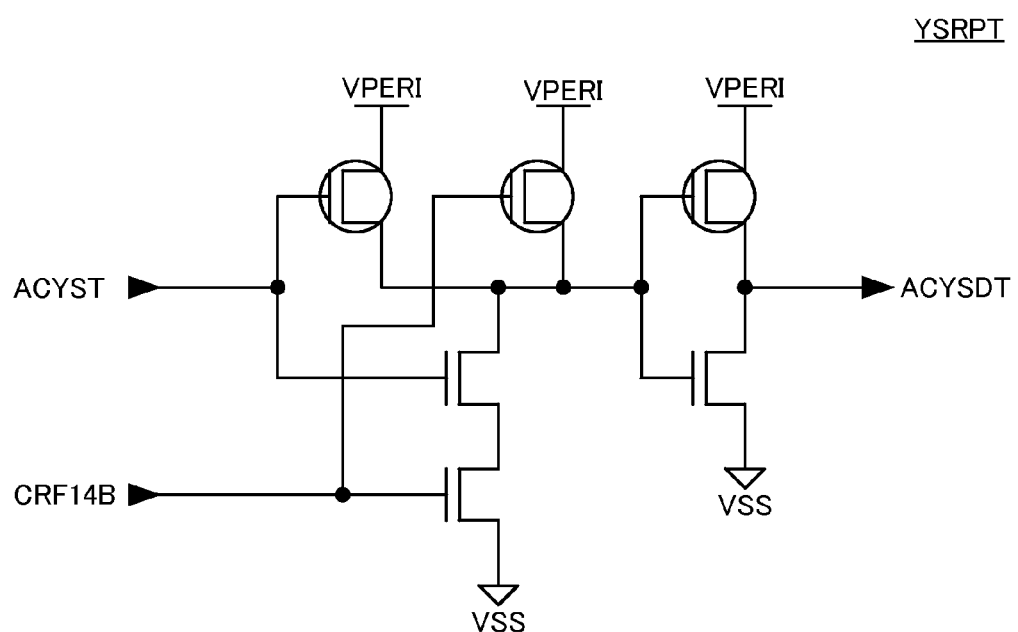
FIG. 9 is a circuit diagram of a repeater circuit according to a second example.

FIG. 9 is a circuit diagram of a repeater circuit YSRPT according to a second example.

As shown in FIG. 9, the repeater circuit YSRPT according to the second example is made up of an AND gate circuit that receives a column selection signal supplied through a column selection line ACYSDT and one bit CRF14B of the row address. The one bit CRF14B of the row address is an inversion signal of the bit X14 of the row address shown in FIG. 1. Accordingly, a repeater operation is performed only when the bit X14 of the row address is low-level. In the case where the bit X14 of the row address is high-level, the column selection line ACYSDT is fixed to a low level (VSS) regardless of the level of the corresponding column selection line ACYST.

The repeater circuit YSRPT according to the second example is activated only in the case where the memory cell array ARY1 is accessed. Accordingly, power consumption can be reduced.

Figure 10:
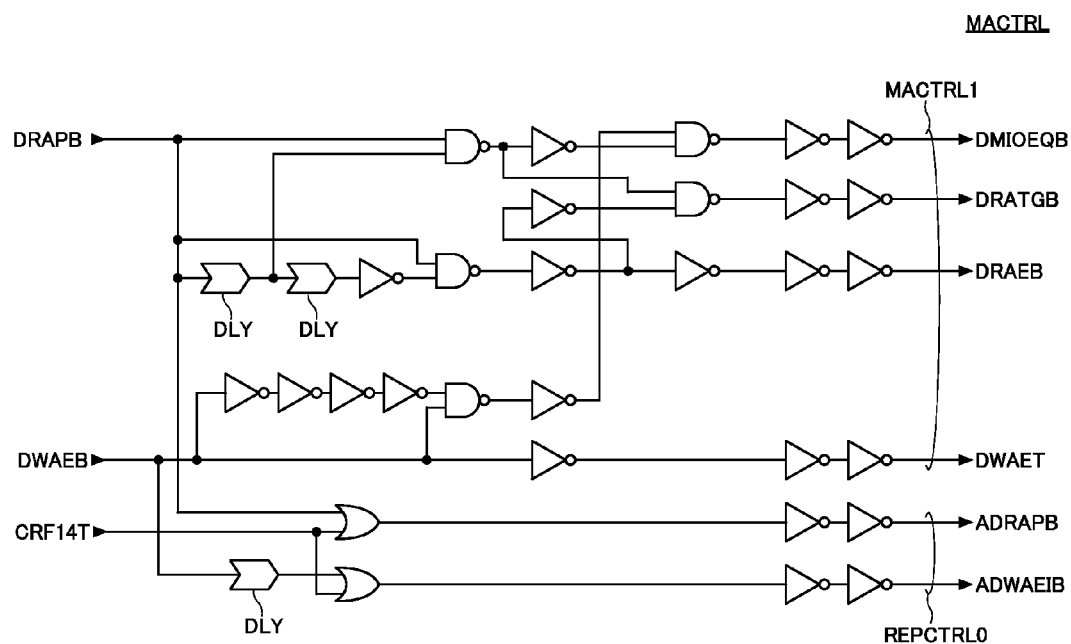
FIG. 10 is a circuit diagram of a control circuit according to an embodiment of the invention.

FIG. 10 is a circuit diagram of the control circuit MACTRL according to an embodiment of the invention.

As shown in FIG. 10, the control circuit MACTRL is a logic circuit that generates various control signals MACTRL1 (DMIOEQB, DRATGB, DRAEB, DWAET) supplied to the main amplifier MA and various control signals REPCTRL0 (ADRAPB, ADWAEIB) supplied to the control circuit RPTCTRL. The control circuit MACTRL receives a read enable signal DRAPB, a write enable signal DWAEB, and one bit CRF14T of the row address. The above control signals are generated based thereon. The one bit CRF14T of the row address is the same signal as the bit X14 of the row address shown in FIG. 1. Thus, the level is low when X14=0.

According to the circuit configuration shown in FIG. 10, when the read enable signal DRAPB changes from high-level to low-level, the equalizing signal DMIOEQB changes to high-level, whereby the pre-charge state of the main data lines DMIOT and DMIOB is canceled. The equalizing signal DMIOEQB becomes high-level also in the case where the write enable signal DWAEB changes from high-level to low-level, whereby the pre-charge state of the main data lines DMIOT and DMIOB is canceled.

In addition, when the read enable signal DRAPB changes from high-level to low-level, the coupling signal DRATGB temporarily becomes low-level, while the read enable signal DRAEB temporarily becomes low-level.

Further, when the read enable signal DRAPB is activated to a low level, on condition that one bit CRF14T of the row address is low-level, the control signal ADRAPB is activated to a low level.

Meanwhile, when the write enable signal DWAEB is activated to a low level, the write enable signal DWAET is activated to a high level, and also, on condition that one bit CRF14T of the row address is low-level, the control signal ADWAEIB is activated to a low level. However, the control signal ADWAEIB has a delay element DLY inserted into its path. Therefore, the control signal ADWAEIB is activated later than the write enable signal DWAET.

Figure 11:
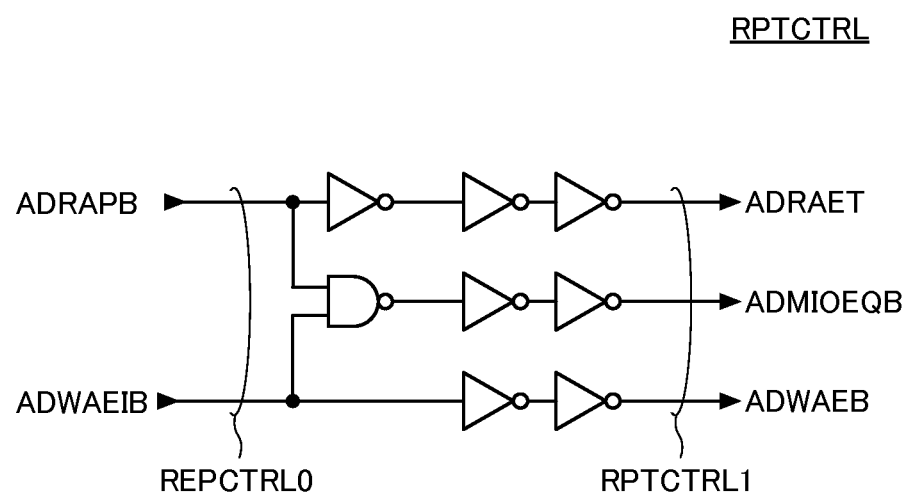
FIG. 11 is a circuit diagram of a control circuit according to an embodiment of the invention.

FIG. 11 is a circuit diagram of the control circuit RPTCTRL according to an embodiment of the invention.

As shown in FIG. 11, the control circuit RPTCTRL generates various control signals RPTCTRL1 (ADRAET, ADMIOEQB, ADWAEB) in response to the control signals REPCTRL0 (ADRAPB, ADWAEIB), and supplies them to the repeater circuit MIORPT shown in FIG. 6. According to the circuit configuration shown in FIG. 11, when the control signal ADRAPB is activated to a low level, the read enable signal ADRAET is activated to a high level, while when the control signal ADWAEIB is activated to a low level, the write enable signal ADWAEB is activated to a low level. In addition, in the case where the control signals ADRAPB and ADWAEIB are both deactivated to a high level, the equalizing signal ADMIOEQB is activated to a low level.

The above is the configuration of the semiconductor device according to this embodiment. Next, the operation of the semiconductor device according to this embodiment will be described.

Figure 12:
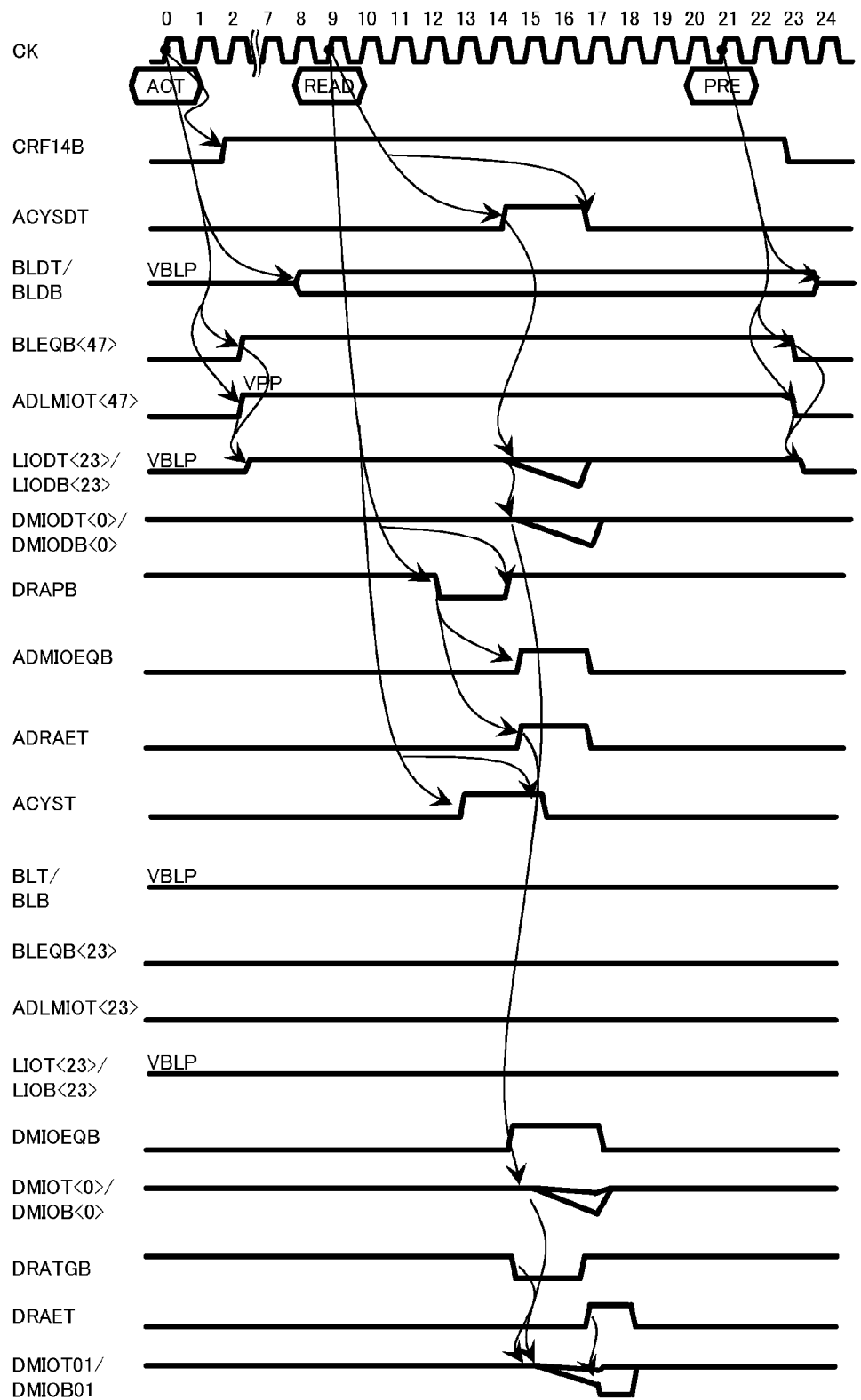
FIG. 12 is an operation waveform diagram for a read operation according to an embodiment of the invention, showing the case where one bit X14 of the row address is "0".
Figure 13:
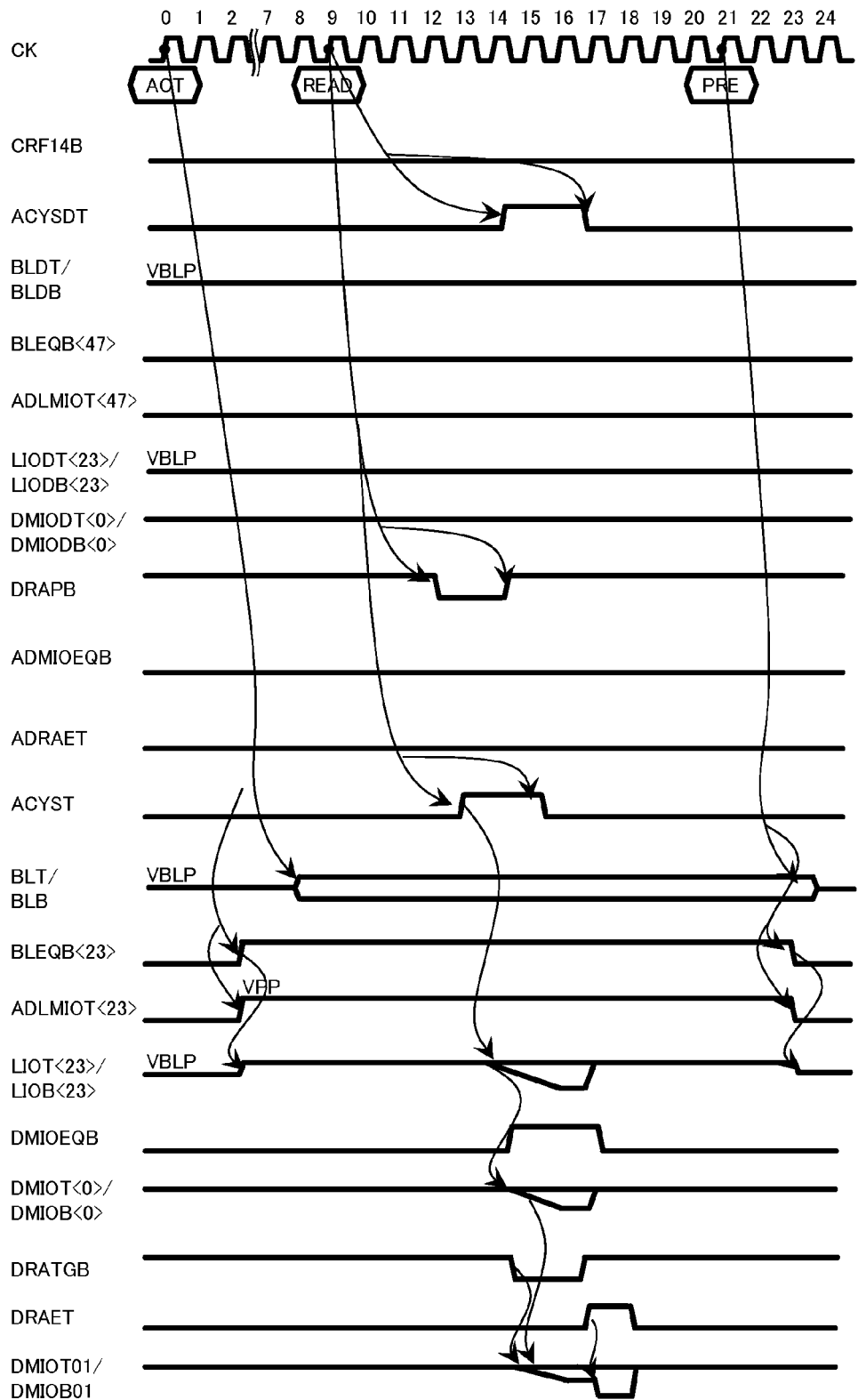
FIG. 13 is an operation waveform diagram for a read operation according to an embodiment of the invention, showing the case where one bit X14 of the row address is "1".

First, a read operation will be described. FIG. 12 and FIG. 13 each show an operation waveform diagram during a read operation according to an embodiment of the invention. FIG. 12 shows the case where one bit X14 of the row address is "0", while FIG. 13 shows the case where one bit X14 of the row address is "1."

In both FIG. 12 and FIG. 13, an active command ACT is issued at the time CK0, a read command READ is issued at the time CK9, and a pre-charge command PRE is issued at the time CK21. These times are each defined by the rising edge of a clock signal CK.

First, in the case where the bit X14 of the row address input in synchronization with the active command ACT is "0", the signal CRF14B changes to high-level as shown in FIG. 12. In addition, in response to the input of the row address, a row access is made to the memory cell array ARY1, and read data appears in predetermined bit lines BLDT and BLDB. During this period of time, on the memory cell array ARY1 side, the equalizing signal BLEQB <47> corresponding to the selected memory mat MAT becomes high-level, and the pre-charge of the local data lines LIODT <23> and LIODB <23> is canceled. Further, the coupling signal ADLMIOT <47> corresponding to the selected memory mat MAT is activated to a high level, and the local data lines LIODT <23> and LIODB <23> are coupled to the main data lines DMIODT <0> and DMIODB <0> through the pass gate circuit PG. At this point of time, the main data lines DMIODT <0> and DMIODB <0> are pre-charged to the VPERI level. Therefore, the local data lines LIODT <23> and LIODB <23> are also pre-charged to the VPERI level. During this period of time, the above operation is not performed on the memory cell array ARY2 side. Subsequently, when a read command READ is issued, the read enable signal DRAPB temporarily changes to low-level. In response to this, the equalizing signal ADMIOEQB and the read enable signal ADRAET temporarily become high-level. Therefore, the pre-charge state of the main data lines DMIODT <0> and DMIODB <0> is canceled, while the read repeater circuit RREP is activated. In addition, the equalizing signal DMIOEQB also becomes high-level, whereby the pre-charge state of the main data lines DMIOT <0> and DMIOB <0> is also canceled.

In addition, when a read command READ is issued, in response to the column address input in synchronization therewith, a predetermined column selection line ACYST is activated, and the corresponding column selection line ACYSDT is activated through the repeater circuit YSRPT. As a result, a predetermined sense amplifier SA is coupled to the local data lines LIODT <23> and LIODB <23>. Therefore, in response to the logical value of the read data, one is maintained at the pre-charge level, while the level of the other decreases. At this point of time, the pass gate circuit PG has already turned on. Accordingly, also with respect to the main data lines DMIODT <0> and DMIODB <0>, one is maintained at the pre-charge level, while the level of the other decreases.

At this point of time, the read repeater circuit RREP has already been activated. Accordingly, the read data on the main data lines DMIODT <0> and DMIODB <0> is transferred to the main data lines DMIOT <0> and DMIOB <0>, and the read data is input into the main amplifier MA.

Then, after the lapse of a predetermined delay, the coupling signal DRATGB temporarily becomes low-level, and the read data on the main data lines DMIOT <0> and DMIOB <0> is transferred to the read data lines DMIOT01 and DMIOB01, while the read enable signal DRAET is activated, whereby the read amplifier RAMP performs an amplification operation. The read data on the read data lines DMIOT01 and DMIOB01 is transferred to the read write buses DRWBST <0> and DRWBSB <0> through the tri-state inverters INV1 and INV2.

Subsequently, when a pre-charge command PRE is issued, the state returns to the initial state before the issue of the active command ACT.

In this way, in the case where X14=0 at the time of a read operation, the memory cell array ARY1 is selected. Therefore, the read data is first output to the main data line DMIOD, transferred to the main data line DMIO through the repeater circuit MIORPT, and then amplified by the main amplifier MA. In this way, in the semiconductor device according to this embodiment, the read data is relayed through the repeater circuit MIORPT. Accordingly, the line length of the main data line can be shortened. As a result, it is unnecessary to use a circuit that requires a high-precision timing control, such as a sub-amplifier. Accordingly, the timing design is facilitated.

In addition, the main amplifier MA is not coupled to the main data line DMIOD assigned on the memory cell array ARY1 side, but the main amplifier MA is coupled only to the main data line DMIO assigned on the memory cell array ARY2 side. Accordingly, in spite of the reduced line length of the main data line, the number of main amplifiers MA can be reduced. Further, main amplifiers MA can be intensively arranged at one end of each memory bank in the X-direction. Therefore, the routing of the read write bus DRWBS can also be minimized. As a result, the area of the peripheral circuit area PERI can also be reduced.

Meanwhile, in the case where the bit X14 of the row address input in synchronization with the active command ACT is "1", the signal CRF14B is maintained low-level as shown in FIG. 13. In addition, in response to the input of the row address, a row access is made to the memory cell array ARY2, and read data appears in predetermined bit lines BLT and BLB. During this period of time, on the memory cell array ARY2 side, pre-charge is canceled, and the pass gate circuit PG is activated. The above operation is not performed on the memory cell array ARY1 side.

Subsequently, when a read command READ is issued, the pre-charge state of the main data lines DMIOT <0> and DMIOB <0> is canceled. The read repeater circuit RREP is maintained in an inactive state.

In addition, when a read command READ is issued, in response to the column address input in synchronization therewith, a predetermined column selection line ACYST is activated. As a result, a predetermined sense amplifier SA is coupled to the local data lines LIOT <23> and LIOB <23>. Therefore, in response to the logical value of the read data, one is maintained at the pre-charge level, while the level of the other decreases. At this point of time, the pass gate circuit PG has already turned on. Accordingly, also with respect to the main data lines DMIOT <0> and DMIOB <0>, one is maintained at the pre-charge level, while the level of the other decreases. As a result, the read data is input to the main amplifier MA.

The operation of a main amplifier MA is as above. The read data amplified by the main amplifier MA is transferred to the read write buses DRWBST <0> and DRWBSB <0>. Subsequently, when a pre-charge command PRE is issued, the state returns to the initial state before the issue of the active command ACT.

In this way, in the case where X14=1 at the time of a read operation, the memory cell array ARY2 is selected, and the read data is directly input into the main amplifier MA through the main data line DMIO. In this case, the main data line DMIOD assigned to the memory cell array ARY1 is not used.

Figure 14:
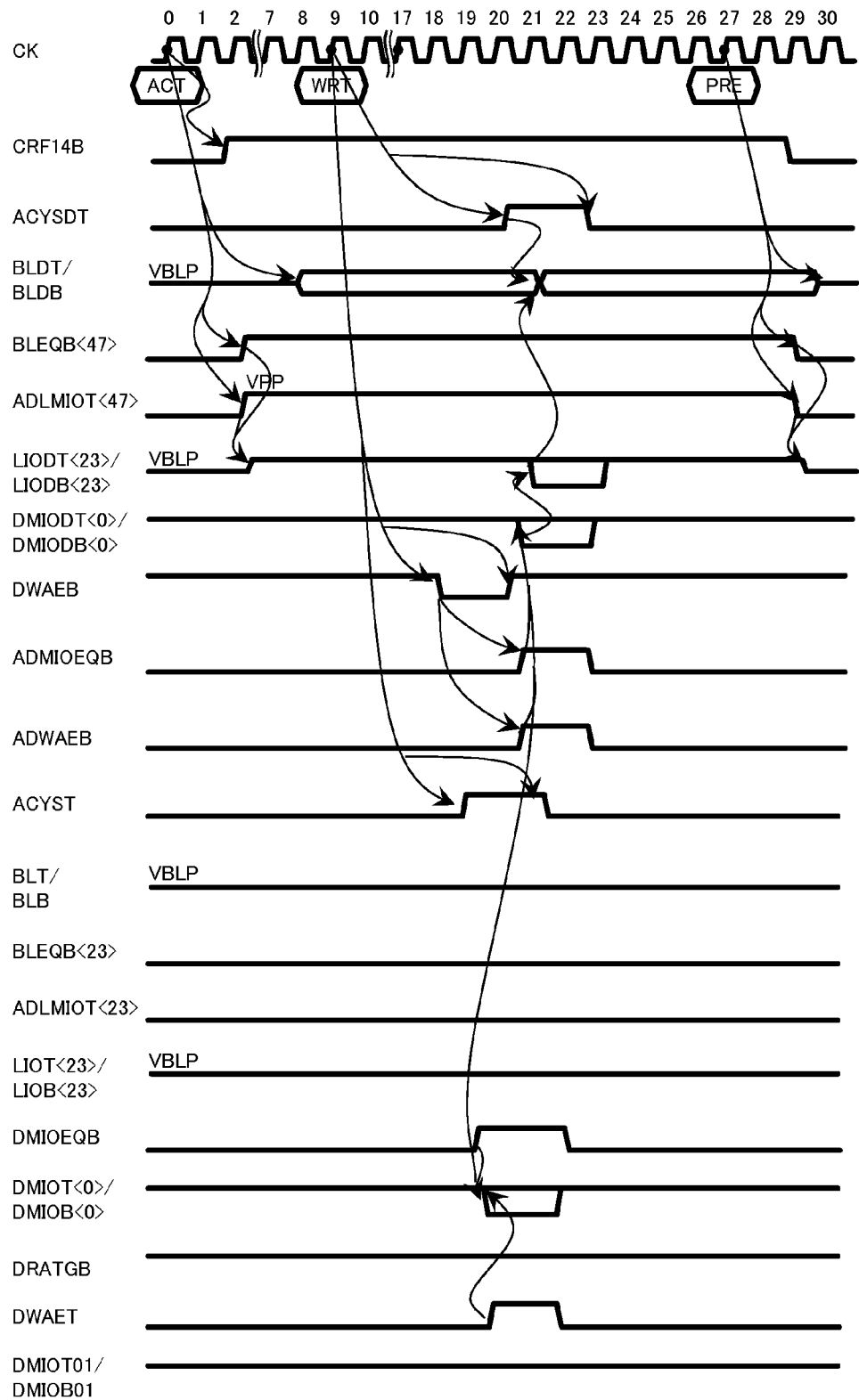
FIG. 14 is an operation waveform diagram for a write operation according to an embodiment of the invention, showing the case where one bit X14 of the row address is "0".
Figure 15:
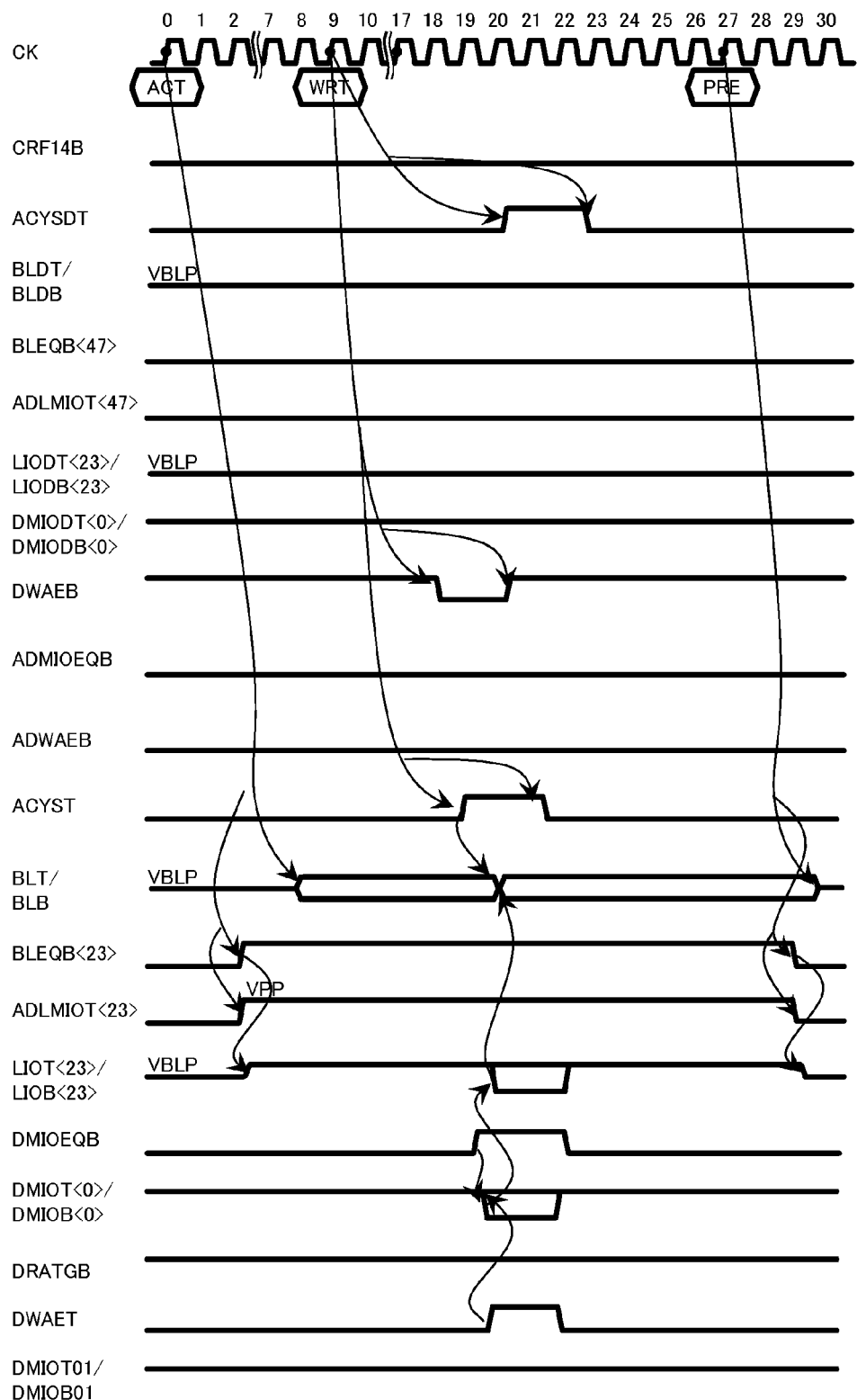
FIG. 15 is an operation waveform diagram for a write operation according to an embodiment of the invention, showing the case where one bit X14 of the row address is "1".

Next, a write operation will be described. FIG. 14 and FIG. 15 each show an operation waveform diagram during a write operation according to an embodiment of the invention. FIG. 14 shows the case where one bit X14 of the row address is "0", while FIG. 15 shows the case where one bit X14 of the row address is "1."

In both FIG. 14 and FIG. 15, an active command ACT is issued at the time CK0, a write command WRT is issued at the time CK9, and a pre-charge command PRE is issued at the time CK27.

As shown in FIG. 14 and FIG. 15, the operation in synchronization with the active command ACT is the same as in a read operation, and a different operation is performed depending on whether the bit X14 of the input row address is "0" or "1".

Subsequently, when a write command WRT is issued, the write enable signal DWAEB temporarily changes to low-level. In response to this, the equalizing signal DMIOEQB and the write enable signal DWAET temporarily become high-level. Therefore, the pre-charge state of the main data lines DMIOT <0> and DMIOB <0> is canceled, while the write data on the read write buses DRWBST <0> and DRWBSB <0> is transferred to the main data lines DMIOT <0> and DMIOB <0>.

Here, in the case where X14=0 at the time of a row access, the control signal ADWAEIB is also activated. Therefore, as shown in FIG. 14, the equalizing signal ADMIOEQB and the write enable signal ADWAEB also temporarily become high-level and low-level, respectively. As a result, the write repeater circuit WREP is activated. When the write repeater circuit WREP is activated, the write data on the main data lines DMIOT <0> and DMIOB <0> is transferred to the main data lines DMIODT <0> and DMIODB <0>. Meanwhile, in the case where X14=1 at the time of a row access, the equalizing signal ADMIOEQB and the write enable signal ADWAEB do not change as shown in FIG. 15. Accordingly, the write data is not transferred from the main data line DMIOT <0> and DMIOB <0> to the main data lines DMIODT <0> and DMIODB <0>.

In addition, when a write command WRT is issued, in response to the column address input in synchronization therewith, a predetermined column selection line ACYST is activated, and the corresponding column selection line ACYSDT is activated through the repeater circuit YSRPT. As a result, in the case where X14=0 at the time of a row access, as shown in FIG. 14, the write data is written in a memory cell through the main data lines DMIODT <0> and DMIODB <0>, the local data lines LIODT <23> and LIODB <23>, and the bit lines BLDT and BLDB. Meanwhile, in the case where X14=1 at the time of a row access, as shown in FIG. 15, the write data is written in a memory cell through the main data lines DMIOT <0> and DMIOB <0>, the local data lines LIOT <23> and LIOB <23>, and the bit lines BLT and BLB.

Subsequently, when a pre-charge command PRE is issued, the state returns to the initial state before the issue of the active command ACT.

In this way, in the case where X14=0 at the time of a write operation, the memory cell array ARY1 is selected. Therefore, the write data output from the main amplifier MA is first output to the main data line DMIO, transferred to the main data line DMIOD through the repeater circuit MIORPT, and then written in the memory cell array ARY1. As a result, as in a read operation, high-precision timing adjustment is not required. Meanwhile, in the case where X14=1 at the time of a write operation, the memory cell array ARY2 is selected. Therefore, the write data output from the main amplifier MA is written in the memory cell array ARY2 through the main data line DMIO. In this case, the main data line DMIOD assigned to the memory cell array ARY1 is not used.

As described above, the semiconductor device according to this embodiment includes a bidirectional repeater circuit MIORPT coupled to the main data line DMIO and to the main data line DMIOD. Accordingly, while reducing the line length of each main data line, the number of main amplifiers MA can be reduced. Further, main amplifiers MA can be intensively arranged at one end of each memory bank in the X-direction. Therefore, the routing of the read write bus DRWBS can also be minimized. As a result, the area of the peripheral circuit area PERI can be reduced.

In addition, because the line length of each main data line is short, the load on main data lines is small. Accordingly, it is unnecessary to provide a sub-amplifier coupled to a main data line and to a local data line, and they can be coupled using a mere pass gate circuit PG. Then, because the pass gate circuit PG turns on at the time of a row access, unlike a sub-amplifier that is activated at the time of a column access, a high-precision timing control is unnecessary.

Accordingly, according to this embodiment, it is possible to provide a semiconductor device that allows peripheral circuits to be reduced in size, and also facilitates the timing design. An embodiment of the present invention has been described above, but the present invention is not limited to the above embodiment. Needless to say, various modifications can be made without departing from the gist of the present invention, and they are also encompassed within the scope of the present invention.

For example, although a main data line and a local data line are coupled by a pass gate circuit in the above embodiment, the pass gate circuit may be replaced with a sub-amplifier.

In addition, although a column selection signal is relayed using a repeater circuit YSRPT in the above embodiment, the use of the repeater circuit YSRPT is not indispensable in the present invention.

Further, although DRAM is taken as an example in the above embodiment, the application of the present invention is not limited thereto. The present invention may also be applied to other memory-type semiconductor devices, such as ReRAM, and may be applied to semiconductor devices having mounted thereon both a memory cell array and a logic circuit.

What is claimed is:
1. A semiconductor device comprising:
   first and second memory cell arrays, each of first and second memory cell arrays including a plurality of memory cells;
   a first main data line arranged above the first memory cell array to transfer data read from the first memory cell array;
   a second main data line arranged above the second memory cell array to transfer data read from the second memory cell array;
   a main amplifier coupled to the second main data line to amplify the data on the second main data line; and
   a repeater circuit coupled to the first and second main data lines, the repeater circuit further comprising:
      a read repeater circuit configured to transfer data on the first main data line to the second main data line;
      a write repeater circuit configured to transfer data from the second main data line to the first main data line; and
      an equalizing circuit configured to precharge the first main data line.

2. The semiconductor device as claimed in claim 1, wherein the repeater circuit is arranged between the first and second memory cell arrays.

3. The semiconductor device as claimed in claim 1, wherein the repeater circuit includes a read repeater circuit to drive the second main data line responsive to the data on the first main data line, and a write repeater circuit to drive the first main data line responsive to the data on the second main data line.

4. The semiconductor device as claimed in claim 3, further comprising a control circuit to activate the main amplifier after activating the read repeater circuit responsive to a read command, and to activate the write repeater circuit after activating the main amplifier responsive to a write command.

5. The semiconductor device as claimed in claim 1, wherein a data read operation is performed on one of the first and second memory cell arrays while a data read operation the other of the first and second memory cell arrays is being out of service.

6. The semiconductor device as claimed in claim 5, wherein the first memory cell array includes a first local data line that may be coupled to the first main data line, and the second memory cell array includes a second local data line that may be coupled to the second main data line.

7. The semiconductor device as claimed in claim 6, wherein the first memory cell array includes a plurality of first bit lines, a selected one of first bit lines coupled to the first local data line, and the second memory cell array includes a plurality of second bit lines, a selected one of the second bit lines coupled to the second local data line.

8. The semiconductor device as claimed in claim 7, wherein the first memory cell array includes a plurality of first column switches, a selected one of the first column switches being turned ON to couple the selected one of the first bit lines to the first local data line, and the second memory cell array includes a plurality of second column switches, a selected one of the second column switches being turned ON to couple the selected one of the second bit lines to the second local data line.

9. A semiconductor device comprising:
   a first memory bank and a second memory bank, each of the first and second memory banks including:
   first and second memory cell arrays,
   a plurality of first main data lines associated with the first memory cell array, a plurality of second main data lines associated with the second memory cell array,
a plurality of main amplifiers, each of the plurality of main amplifiers coupled to an associated one of the plurality of second main data lines, and
a plurality of repeater circuits each coupled to an associated one of the plurality of first main data lines and to an associated one of the plurality of second main data lines, each repeater circuit of the plurality of repeater circuits further comprising:
a read repeater circuit configured to transfer data on the associated one of the plurality of first main data lines to an associated one of the plurality of main amplifiers via the associated one of the second main data lines;
a write repeater circuit configured to transfer data from the associated one of the second main data lines to the associated one of the first main data lines;
an equalizing circuit configured to precharge the associated one of the first main data lines; and
a plurality of data buses each coupled to an associated one of the plurality of main amplifiers of the first memory bank and further coupled to an associated one of the plurality of main amplifiers of the second memory bank.

10. The semiconductor device as claimed in claim 9, wherein each of the plurality of data buses includes a first bus coupled to an associated one of the plurality of main amplifiers of the first memory bank and a second bus coupled to an associated one of the plurality of main amplifiers of the second memory bank, and the semiconductor device further comprises a plurality of data repeater circuits each coupled to the first and second buses of an associated one of the plurality of data buses.

11. The semiconductor device as claimed in claim 9, wherein the first memory cell array includes a plurality of first local data lines to transfer data read from the first memory cell array to the plurality of first main data lines, and the second memory cell array includes a plurality of second local data lines to transfer data read from the second memory cell array to the plurality of second main data lines.

12. The semiconductor device as claimed in claim 11, wherein the first memory cell array includes a plurality of first sense amplifiers and includes a plurality of first bit lines each coupled to an associated one or ones of memory cells therein and to an associated one of the plurality of first sense amplifiers, and the second memory cell array includes a plurality of second sense amplifiers and includes a plurality of second bit lines each coupled to an associated one or ones of memory cells therein and to an associated one of the plurality of second sense amplifiers.

13. The semiconductor device as claimed in claim 12, wherein the first memory cell array includes a plurality of first switches each coupled to an associated one of the plurality of first sense amplifiers and to an associated one of the plurality of first local data lines, and the second memory cell array includes a plurality of second switches each coupled to an associated one of the plurality of second sense amplifiers and to an associated one of the plurality of second local data lines.

14. The semiconductor device as claimed in claim 13, further comprising a plurality of first select lines each coupled to an associated one of the plurality of first switches, a plurality of second select lines each coupled to an associated one of the plurality of second switches, and a plurality of switch repeaters coupled to an associated one of the plurality of first select lines and to an associated one of the plurality of second select lines to transfer a select signal to the associated one of the plurality of first select lines from the associated one of the plurality of second select lines.

15. A semiconductor memory device comprising:
a first memory cell array;
a second memory cell array;
a plurality of first main IO lines associated with the first memory cell array;
a plurality of second main IO lines provided for the second memory cell array;
wherein the first memory cell array includes
a memory mat including a plurality of memory cells each coupled to an associated one of a plurality of bit lines and to an associated one of a plurality of sub word lines,
a sub word driver circuit coupled to the plurality of sub word lines; and
a plurality of sense amplifier circuits each coupled to an associated one of the plurality of bit lines and to an associated one of the plurality of first main IO lines to amplify data on the associated one of the plurality of bit lines and transfer the amplified data to the associated one of the plurality of first main IO lines responsive to a plurality of control signals,
wherein the second memory cell array includes
a memory mat including a plurality of memory cells each coupled to an associated one of a plurality of bit lines and to an associated one of a plurality of sub word lines,
a sub word driver circuit coupled to the plurality of sub word lines; and
a plurality of sense amplifier circuits each coupled to an associated one of the plurality of bit lines and to an associated one of the plurality of second main IO lines to amplify data on the associated one of the plurality of bit lines and transfer the amplified data to the associated one of the plurality of second main IO lines responsive to the plurality of control signals,
a plurality of first control lines each coupled to an associated one of the plurality of sense amplifier circuits of the first memory cell array;
a plurality of second control lines each couple to an associated one of the plurality of sense amplifier circuits of the second memory cell array; and
a plurality of repeater circuits coupled to an associated one of the plurality of first main IO lines and to an associated one of the second main IO lines, each of the plurality of repeater circuits further comprising:
a read repeater circuit configured to transfer data on the associated one of the plurality of first main IO lines to the associated one of the second main IO lines;
a write repeater circuit configured to transfer data from the associated one of the plurality of second main IO lines to the associated one of the first main IO lines; and
an equalizing circuit configured to precharge the associated one of the plurality of first main IO lines.

16. The device as claimed in claim 15, further comprising a plurality of main IO repeater circuits each coupled to an associated one of the plurality of first main IO lines and to an associated one of the plurality of second main IO lines.

17. The device as claimed in claim 15, further comprising a plurality of main amplifiers each coupled to an associated one of the plurality of first main IO lines.

18. The device as claimed in claim 15, further comprising a decoder circuit coupled to the plurality of first lines to supply the plurality of control signals respectively to the plurality of first lines.

19. The device as claimed in claim 15, wherein the plurality of first main IO lines and the plurality of first lines are arranged in parallel and the plurality of second main IO lines and the plurality of second lines are arranged in parallel.

20. The device as claimed in claim 15, wherein each of the plurality of sense amplifier circuits in the first and second memory cell arrays includes a plurality of switch transistors each coupled an associated one of the plurality of main IO lines therein and including a control terminal to receive an associated one of the plurality of control signals.

\* \* \* \* \*